(12) United States Patent
Tomita et al.

(10) Patent No.: US 6,614,190 B2
(45) Date of Patent: Sep. 2, 2003

(54) ION IMPLANTER

(75) Inventors: Hiroyuki Tomita, Hitachi (JP); Kazuo Mera, Hitachi (JP); Isao Hashimoto, Hitachi (JP); Yasunori Nakano, Hitachioota (JP); Takayoshi Seki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/939,749

(22) Filed: Aug. 28, 2001

(65) Prior Publication Data
US 2002/0105277 A1 Aug. 8, 2002

(30) Foreign Application Priority Data

Jan. 31, 2001 (JP) .................................... 2001-023241
Jan. 31, 2001 (JP) .................................... 2001-023386

(51) Int. Cl.⁷ ........................... H05B 31/26; G21K 5/10
(52) U.S. Cl. .................... 315/111.81; 250/492; 250/21
(58) Field of Search ................. 315/111.81; 250/492.2, 250/492.21, 442.11, 492.3

(56) References Cited

U.S. PATENT DOCUMENTS

| | | | | |
|---|---|---|---|---|
| 5,393,984 A | * | 2/1995 | Glavish | 250/396 ML |
| 5,483,077 A | * | 1/1996 | Glavish | 250/396 R |
| 5,753,923 A | * | 5/1998 | Mera et al. | 250/442.11 |
| 5,945,681 A | * | 8/1999 | Tokiguchi et al. | 250/492.21 |
| 6,271,529 B1 | * | 8/2001 | Farley et al. | 250/251 |
| 6,326,630 B1 | * | 12/2001 | Yamashita | 250/398 |
| 6,335,535 B1 | * | 1/2002 | Miyake et al. | 250/423 R |
| 6,362,490 B1 | * | 3/2002 | Tomita et al. | 250/251 |
| 6,403,969 B1 | * | 6/2002 | Mera et al. | 250/492.21 |

FOREIGN PATENT DOCUMENTS

| | | |
|---|---|---|
| JP | 61-116746 | 6/1986 |
| JP | 4-110466 | 4/1992 |
| JP | 5-21408 | 1/1993 |
| JP | 5--013038 | 1/1993 |
| JP | 5-326676 | 12/1993 |
| JP | 6-224281 | 8/1994 |
| JP | 6-236913 | 8/1994 |
| JP | 9-63531 | 3/1997 |
| JP | 10-102249 | 4/1998 |

* cited by examiner

Primary Examiner—Don Wong
Assistant Examiner—Minh D A
(74) Attorney, Agent, or Firm—Mattingly, Stanger & Malur, P.C.

(57) ABSTRACT

A wafer holder for holding a wafer includes a wafer holder base, a wafer fixing part, holder pins, a bearing, a housing, and a coil spring. The wafer fixing part is fixed to an outer circumference of a wafer holder. The holder pins are arranged to face the wafer fixing part. The holder pin is rotatably supported by the bearing. The holder pins are movably supported along the diameter direction of the wafer holder base by the coil spring. In the process of holding a side of the wafer with the holder pins, when force from the wafer works on the holder pins, the holder pins are rotated with a Z axis as a center, thus reducing frictional force between the holder pin and the wafer. Accordingly, it is possible to prevent particle generation from holding an implanting object.

25 Claims, 14 Drawing Sheets

ION IMPLANTER

BACKGROUND OF THE INVENTION

1. Field of the Invention

The present invention relates to an ion implanter, and particularly, relates to an ion implanter for SIMOX (Separation by Implanted Oxygen) which is suitable for implanting oxygen ions into a silicon wafer as an implanting object.

2. Description of the Related Art

Ion implanters which irradiate ion beams from an ion source into a processing chamber to implant oxygen ions to a silicon wafer arranged in the processing chamber, have been conventionally known as a device to implant ions into a silicon wafer. Among this type of ion implanter, Japanese Unexamined Patent Application Publication No. 61-116746, for instance, discloses a device in which a silicon wafer is arranged on a disc-shaped wafer holder and a side of the silicon wafer is held by a holder pin.

A side of a silicon wafer is conventionally held by a holder pin. However, it is not fully considered that particles generate when a silicon wafer is mounted on a silicon holder, and that particles generate due to heat vibration, mechanical vibration or the like during heating of the silicon wafer or ion implantation.

Particularly, when particles accumulate on a silicon wafer in an ion implanter for SIMOX, implantation defects are formed during ion implantation and the defects become pinholes of an insulating layer. Accordingly, insulation of the silicon wafer deteriorates, lowering the quality of the wafer. The particles are generated by various processes such as the mounting process of a silicon wafer onto a wafer holder, heating process, ion implantation process, and the like.

First, during the mounting process of a wafer, a silicon wafer is held still at a specific location by a wafer holding mechanism when the silicon wafer is set on a wafer holder. Thus, friction or rubbing is generated between the wafer and the holding mechanism during the process of holding the silicon wafer still, and particles are generated by friction or rubbing.

On the other hand, in the heating and implanting process, a silicon wafer is initially heated by a heater, and is then heated further by the irradiation of ion beams. When the silicon wafer is heated during the process of heating with ion beams and simultaneously controlling a constant high temperature by adjusting the output of the heater, heat expands the silicon wafer. At the same time, friction or rubbing is generated between the silicon wafer and the holding mechanism, generating particles due to friction or rubbing.

Thus, there is a problem in that particles generate due to friction or rubbing between a silicon wafer and a holding mechanism if the silicon wafer is simply held during a holding process.

As disclosed in Japanese Unexamined Patent Application Publication No. 5-326676, a silicon wafer may be held by a pair of dampers at the sides thereof and simultaneously clamped at constant clamp force while the dampers are held in a rocking manner, to flex the clampers. However, since the dampers are simply flexed when the dampers and the silicon wafer are in contact with each other, friction or rubbing is still generated between each damper and the silicon wafer, depending on the manner or the timing of friction between the damper and the silicon wafer. Accordingly, the possible generation of particles still remains.

Additionally, in an ion implanter which implants oxygen ions or the like into a silicon wafer arranged in a processing chamber by irradiating ion beams from an ion source into the processing chamber, a silicon wafer is supported on a disc-shaped wafer holder as described above. As a wafer holder material, silicon or quartz is used. In other words, the wafer holder is made of the same material as the silicon wafer, such as silicon and quartz, so as to prevent the generation of particles from the wafer holder.

Generally, in an ion implanter, particularly an ion implanter for SIMOX, a wafer holder that is joined to a rotary disk through an arm holder, is rotated at 500 rpm under high temperature of 500° C. or higher, and at the same time, is scanned. Oxygen ions are implanted into a silicon wafer on the wafer holder for about four hours in this state, so that it is necessary to prevent foreign matter contamination and the generation of particles. In this case, foreign matter contamination can be prevented by restricting the material of members arranged near the silicon wafer to which ion beams are irradiated. In other words, the same material as the silicon wafer, such as silicon and quartz, can be used as a material for the wafer holder to which ion beams are irradiated while the silicon wafer is held, thereby preventing foreign matter contamination.

However, even if the same material as the silicon wafer, such as silicon and quartz, is used for a wafer holder, silicon and quartz have poor contactability with the silicon wafer, thus generating particles at a contact point between the holder and the wafer.

It is an object of the present invention to provide an ion implanter which can prevent particles generated by holding an implanting object.

SUMMARY OF THE INVENTION

In order to solve the above-noted problems, an ion implanter according to a first aspect of the present invention has a processing chamber which forms a processing space for an implanting object in a vacuum atmosphere; an ion beam irradiating means to irradiate an ion beam output from an ion source into the processing chamber; a holding means which is arranged in the processing chamber and movably holds the implanting object; and a carrier means to shift the holding means in a propagation region of an ion beam in the processing chamber as a passing region of the implanting object. Contacting parts of the holding means with the implanting object are rotatable at an axis which is parallel to an axial center of a holder base as a center of rotation.

Since the contacting parts of the holding means with the implanting object are rotatable at the axis which is parallel to the axial center of a holder, the contacting parts rotate when friction or rubbing occurs between the implanting object and the holding means by holding the implanting object with the holding means. Thus, friction or rubbing is avoided, preventing particles from generating.

Specifically, when friction or rubbing is generated between the holding member and a silicon wafer due to heat vibration or mechanical vibration by mounting the silicon wafer as an implanting object on the holder base or by holding a side of the silicon wafer on the holder base with the fixing member and the holding member, the holding member rotates, thus avoiding friction or rubbing between the holding member and the silicon wafer and preventing particles from generating. Accordingly, the quality of the silicon wafer improves.

Furthermore, an ion implanter according to a second aspect of the present invention has a processing chamber which forms a processing space for an implanting object in a vacuum atmosphere; an ion beam irradiating means to irradiate an ion beam output from an ion source into the processing chamber; a holding means which is arranged in the processing chamber and movably holds the implanting object; and a carrier means to shift the holding means in a propagation region of an ion beam in the processing chamber as a passing region of the implanting object. Contacting parts of the holding means with the implanting object are made of a material which has good contactability with the implanting object.

Since a material which has good contactability with the implanting object is used as a material for the contacting parts of the holding means with the implanting object, the implanting object can be rotated at 500 rpm under high temperature of, for instance, 500° C. or more. Moreover, even when the ion beam is implanted for about four hours, particles can be prevented from generating from the contacting parts. Accordingly, quality improves.

DESCRIPTION OF THE PREFERRED EMBODIMENT

Figure 1:
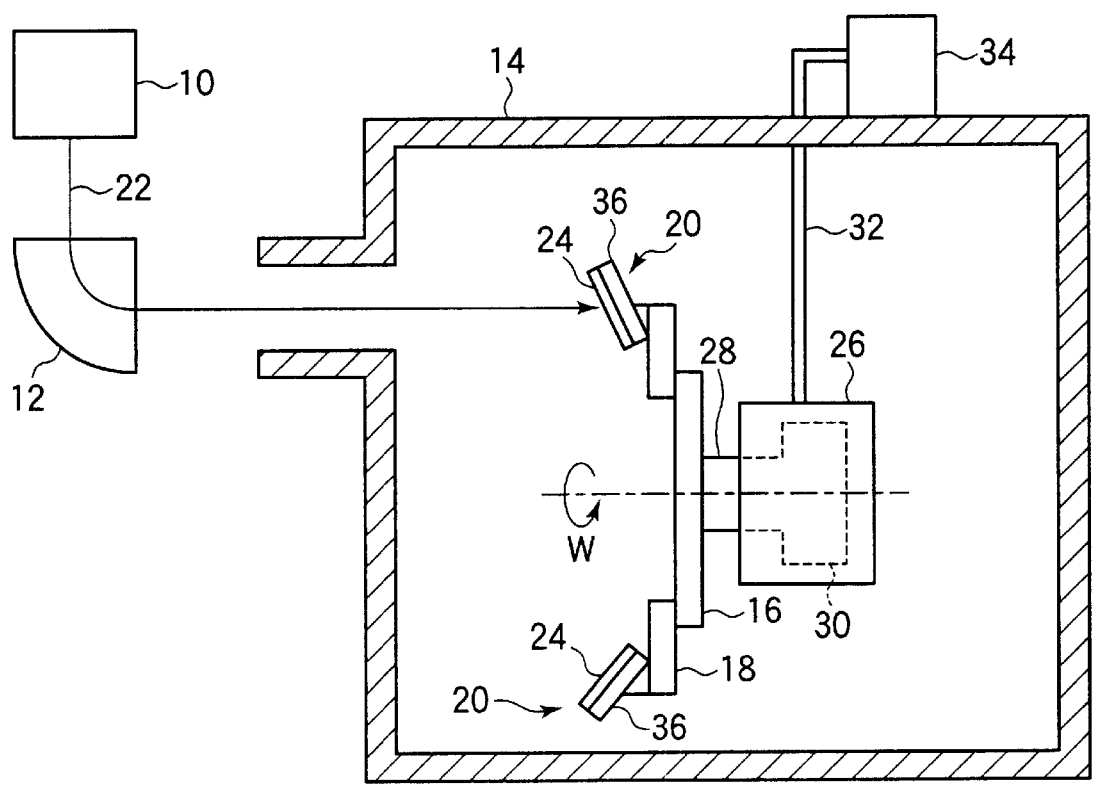
FIG. 1 is a view, showing an entire configuration of an ion implanter according to a first embodiment of the present invention.

A first embodiment of the present invention will be explained below based on drawings. FIG. 1 is a view, showing an entire configuration of an ion implanter according to the first embodiment of the present invention. The ion implanter includes an ion source 10, a mass separator 12, a processing chamber (end station) 14, a rotary disk 16, a holder arm 18, a wafer holder 20 and the like in FIG. 1.

The ion source 10 is linked to the mass separator 12 through an evacuated pipe (not shown in the figure), generating an ion beam 22 of oxygen ions by using micro waves of 2.45 GHz and emitting the ion beam 22 to the mass separator 12. The mass separator 12 is connected to the processing chamber 14 through an evacuated pipe (not shown in the figure). The mass separator 12 is an ion beam irradiating means to deflect the ion beam 22 by about 90 degrees by adding electromagnetic force for the ion beam 22 from the ion source 10, and to separate and remove only ions having a required mass, for instance, oxygen ions out of the ion beam 22 and then to irradiate the ion beam 22 of oxygen ions into the processing chamber 14 as specific ions. The processing chamber 14 is evacuated by an evacuating device (not shown in the figure), forming a processing space for a wafer (silicon wafer) 24 as an implanting object in a vacuum atmosphere. The processing chamber 14 contains the rotary disk 16, the holder arm 18, the wafer holder 20, a motor box 26 and the like therein.

Figure 2A:
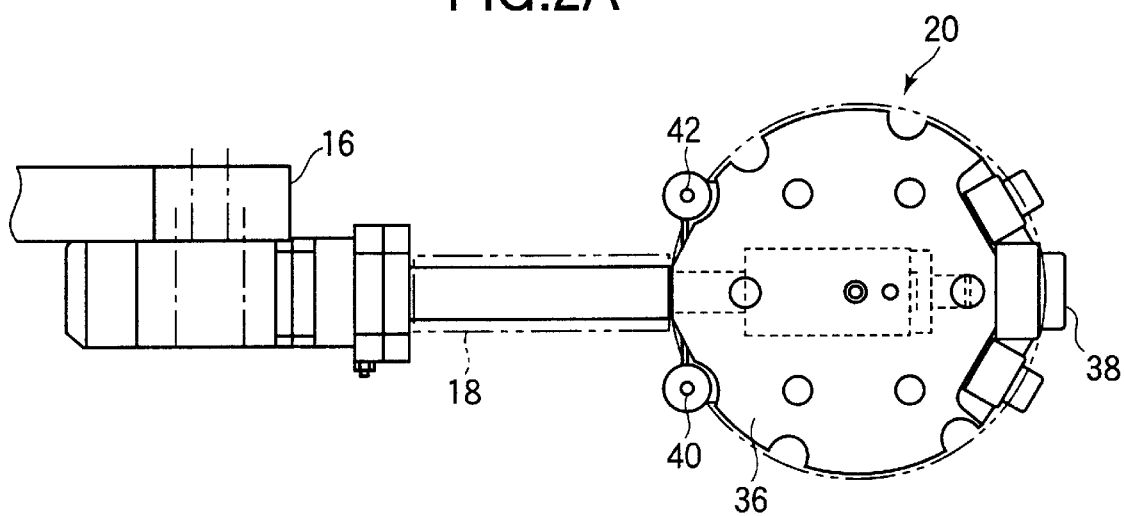
FIG. 2A is a side view, showing relations between a wafer holder and a holder arm during a wafer mounting process.
Figure 2B:
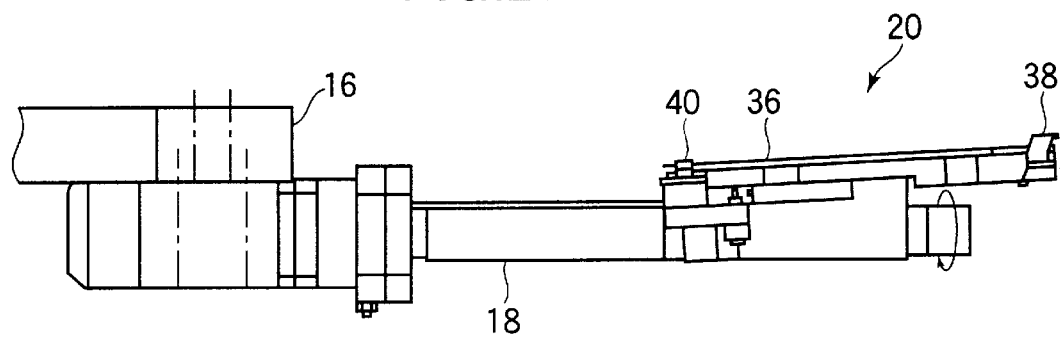
FIG. 2B is a side view, showing relations between the wafer holder and the holder arm during a beam irradiating process.

The rotary disk 16 is connected to a driving source, such as a motor 30, inside the motor box 26 through a rotary shaft 28 as one element of a carrier means to shift the wafer holder 20 in a propagation region of the ion beams 22 of specific ions as a passing region of the wafer 24, thus being rotated and driven. A plurality of holder arms 18, for instance, eighteen arms, are arranged at the outer circumference of the rotary disk 16. A base end of each holder arm 18 is rotatably linked to the rotary disk 16 with its axial center as the center of rotation. The wafer holder 20 is fixed to a tip of each holder arm 18 with about a 3 degree inclination relative to an orthogonal axis, and the wafer 24 is arranged on the wafer holder 20. In other words, each wafer holder 20, as shown in FIG. 2A, is nearly parallel to a horizontal surface (about a 3 degree inclination) when the wafer 24 is being mounted (when the wafer 24 reached a wafer mounting position by the rotation of the holder arm 18). When the ion beam 22 is irradiated to the wafer 24, the holder arm 18 rotates from the position shown in FIG. 2A by 90 degrees at the axial center as the center of rotation, and is arranged roughly orthogonal to the ion beam 22. The ion beam 22 is sequentially irradiated to the wafer 24 on each wafer holder 20 as the holder arm 18 and the wafer holder 20 rotate along with the rotation of the rotary disk 16.

Figure 3:
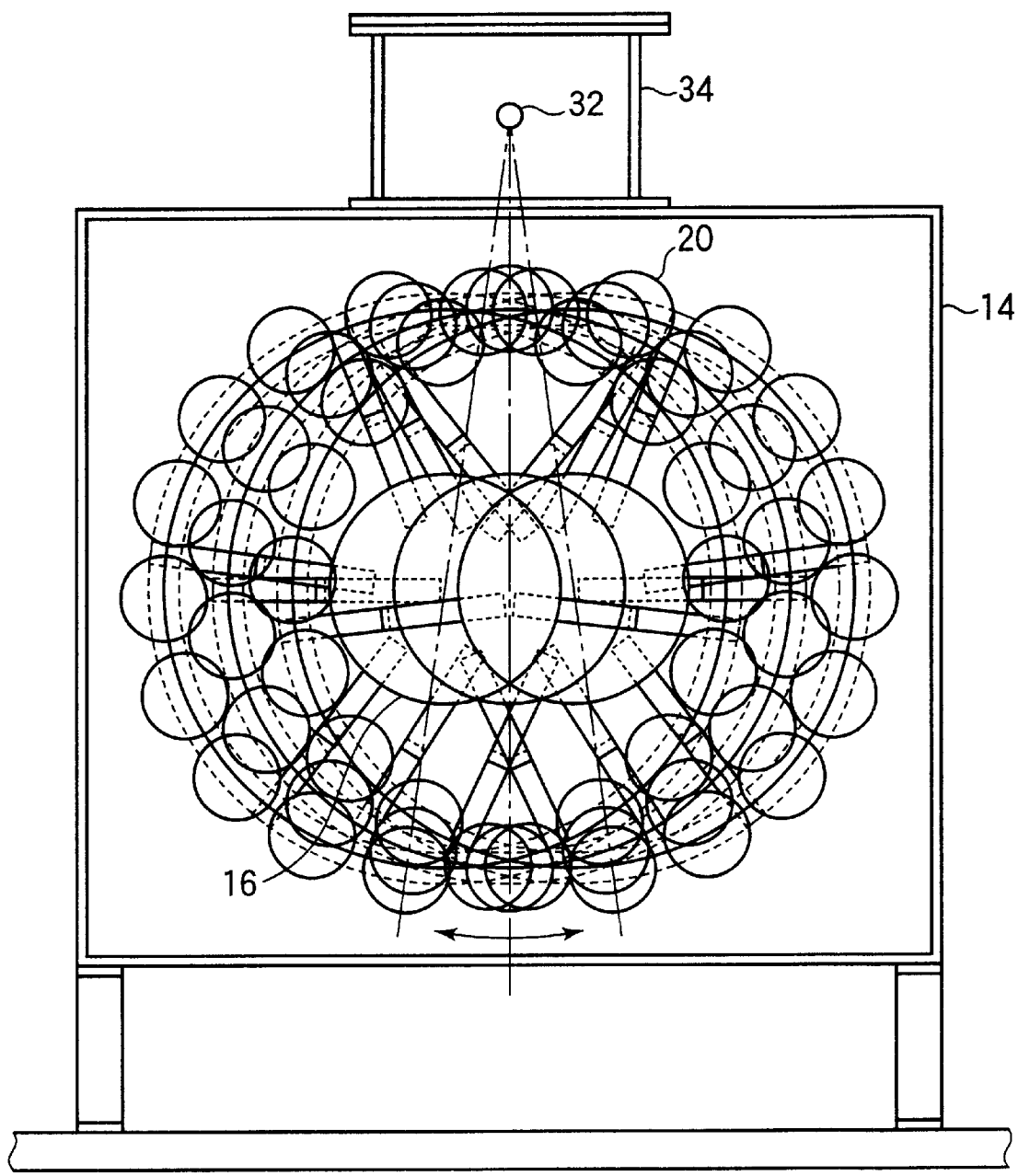
FIG. 3 is a view, explaining the scanning and rotating method of a wafer.

Furthermore, the motor box 26 is linked to a rocking mechanism 34 through the arm 32 so as to irradiate the ion beam 22 over an entire surface of the wafer 24 in the embodiment, and the rocking mechanism 34 makes the motor box 26 move like a pendulum. When the motor box 26 moves like a pendulum, the ion beam 22 sequentially scans over an entire surface of the wafer 24 on each wafer holder 20 along with the rotation of the rotary disk 16 as shown in FIG. 3. The ion beam 22 irradiates an entire surface of the wafer 24 by the scanning.

Each holder arm 18 is made of aluminum. The tip thereof is bent in an orthogonal direction to a plane of rotation of each holder arm 18, in other words, in an orthogonal direction to the irradiation direction of the ion beam 24. A wafer holder base 36 is fixed to the tip of the bent portion.

Figure 4:
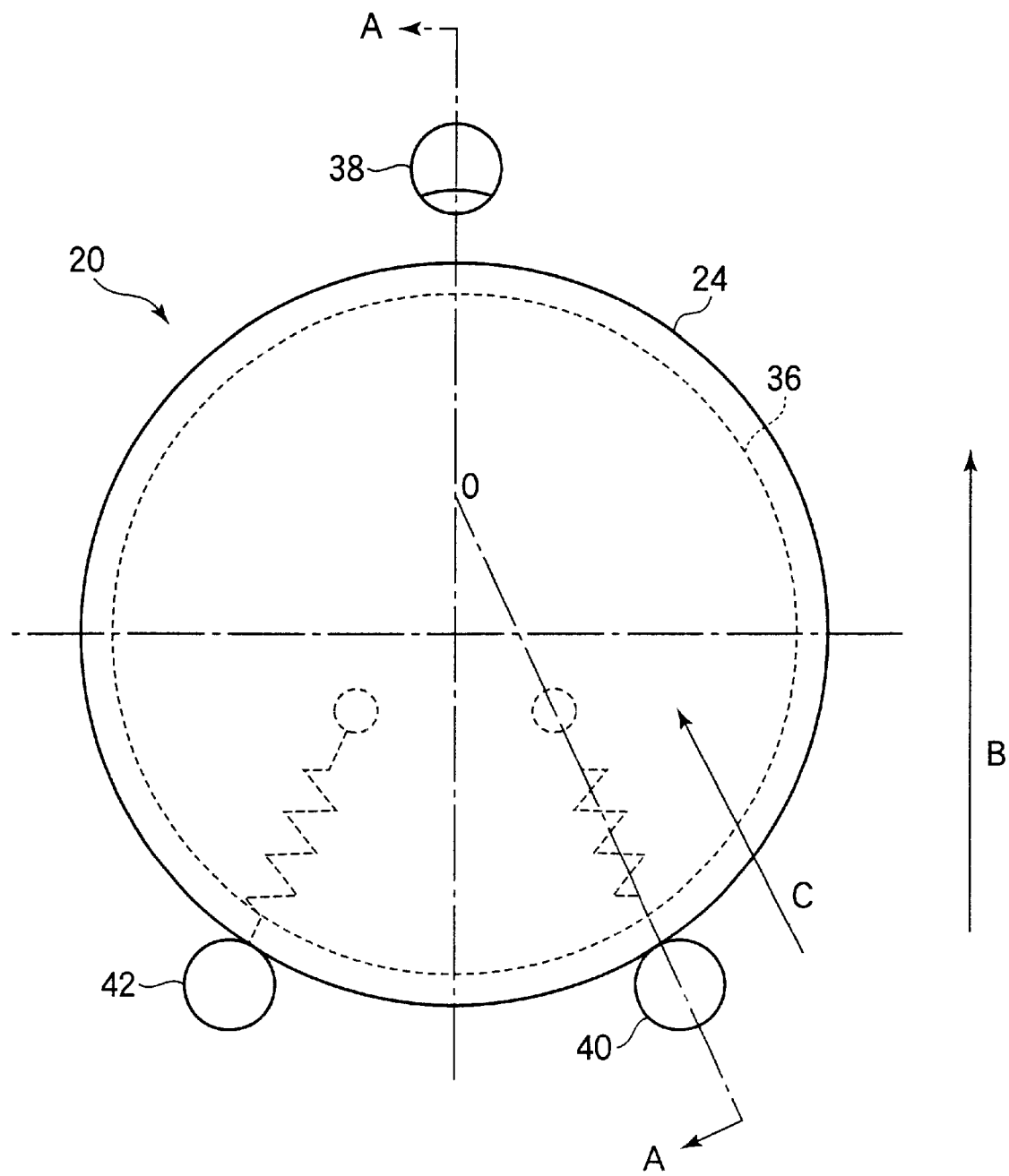
FIG. 4 is a front view, explaining relations between a wafer mounting part and a holder pin.
Figure 5:
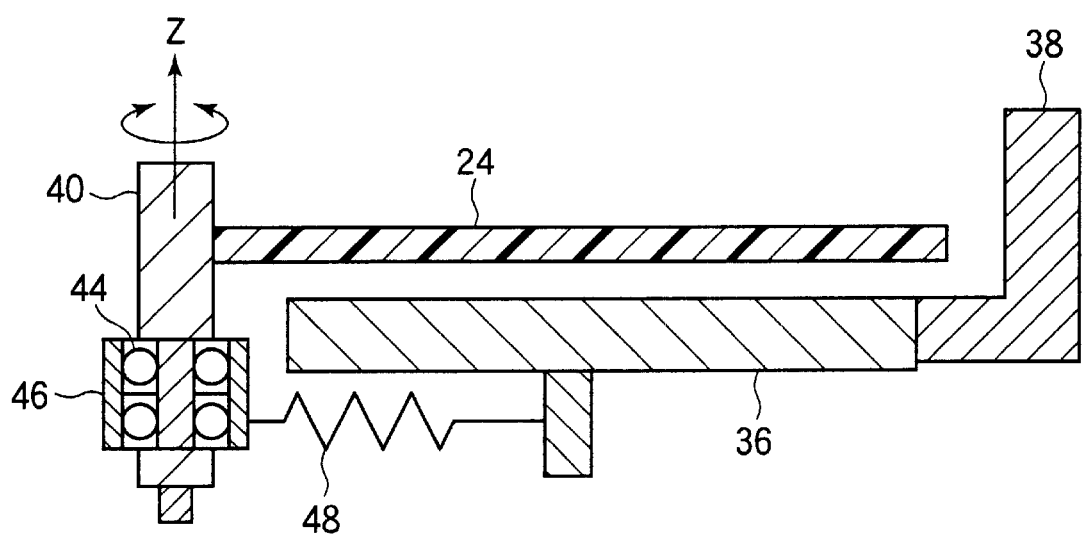
FIG. 5 is a diagram, explaining relations between the wafer mounting part and the holder pin, and is a cross section taken along the line A—A in FIG. 4.

Each wafer holder base 36 is formed of aluminum in a disc shape. As shown in FIGS. 4 and 5, a wafer fixing part 38 is fixed to the outer circumference of each wafer holder base 36 as a fixing member. Holder pins 40 and 42 are also movably arranged in a diameter direction of the wafer holder base 36 as holding members.

A part of the wafer fixing part 38 protrudes along the diameter direction of the wafer holder base 36 at the outer circumference of the wafer holder base 36, and a surface which is in contact with the outer circumference of the silicon wafer 24 arranged on the wafer holder base 36, is formed in a circular shape having the same curvature as the outer shape of the disc-shaped wafer 24.

The holder pins 40 and 42 are formed in a cylindrical shape, and the bottom sides thereof are connected in one body with rotary shafts 40a and 42a. The rotary shafts 40a and 42a are rotatably supported by a ceramic bearing 44. The bearing 44, together with a housing 46 and a coil spring 48 as an elastic body, constitute supporting members. The supporting members are movably arranged in the diameter direction of the wafer holder base 36. The members also rotatably support the holder pin 40 at an axis parallel to the axial center of the wafer holder base 36 (Z axis) as the center of rotation, in other words, at the rotary shafts 40a and 42a as the center of rotation. The housing 46 is connected to the wafer holder base 36 through a pin (not shown in the figure) in a rocking manner, and is also connected to the wafer holder base 36 through the coil spring 48. Furthermore, an end of the housing 46 is linked to a pusher (not shown in the figure). When the wafer 24 is set on the wafer holder base 36, the housing 46 separates from the wafer holder base 36 as it opposes the spring force (elastic force) of the coil spring 48 due to driving of the pusher. The wafer 24 is then set over the wafer holder base 36. When the pusher stops driving after the wafer 24 is set over the wafer holder base 36, the housing 46 rocks at the pin as a fulcrum due to the spring force of the coil spring 48, and shifts towards the wafer holder base 36.

In other words, the wafer holder 20, as a holding means to movably hold the wafer 24, has the wafer holder base 36, the wafer fixing part 38, the holder pins 40 and 42, the bearing 44, the housing 46 and the coil spring 48 in the embodiment. The outer periphery of the wafer 24 is held at three points of the wafer fixing part 38 and two holder pins 40 and 42.

Furthermore, the holder pins 40 and 42, as parts in contact with the wafer 24, are rotatable. The holder pins 40 and 42 prevent friction or rubbing against the wafer 24 by the rotation of the holder pins 40 and 42 when the friction or rubbing is generated by holding the side of the wafer 24 with the holder pins 40 and 42, thus preventing particle generation.

Figure 6:
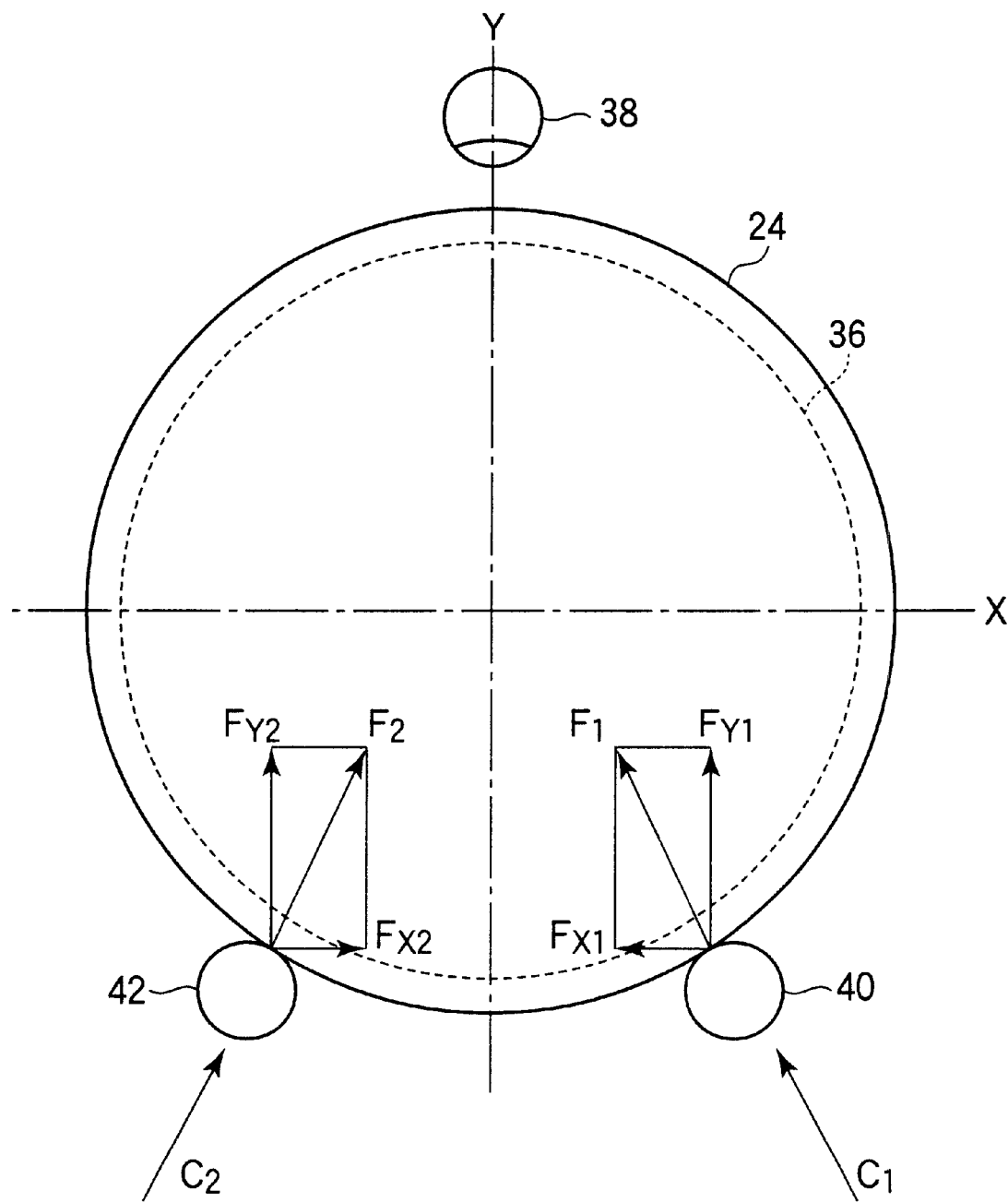
FIG. 6 is a front view, explaining moving directions of a holder pin.

Specifically, in chucking the wafer 24, the wafer 24 is shifted in a horizontal direction for chucking until an end of the wafer 24 contacts the wafer fixing part 38 while the holder pins 40 and 42 are in contact with the side of the wafer 24. The shifting direction of the wafer 24 is an arrow B. However, the shifting directions of the holder pins 40 and 42 are determined by the way of mounting the coil spring 48, and are arrows C1 and C2. In this case, forces F1 and F2 work on the holder pins 40 and 42, respectively, from the coil spring 48. When the forces F1 and F2 are distinguished in the X direction and the Y direction, including the shifting direction of the wafer 24, they can be divided into $F_{X1}$, $F_{X2}$ and $F_{Y2}$. In this case, since $F_{X1}$ and $F_{X2}$ are in balance in the X direction, the wafer 24 does not shift in the X direction. However, the wafer 24 shifts in the Y direction as force works in the Y direction. Accordingly, the wafer 24 shifts in the B direction in FIG. 6.

Figure 7:
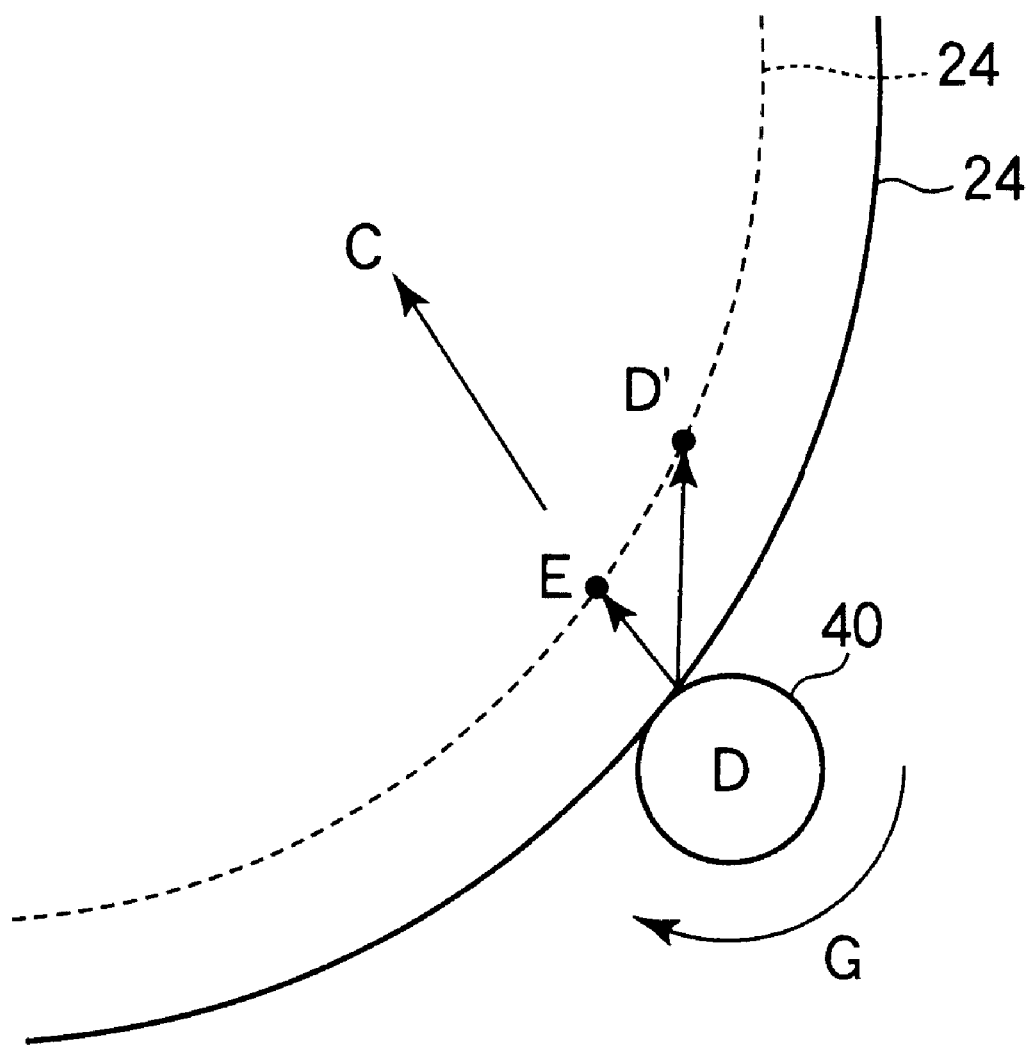
FIG. 7 is a partly enlarged front view, explaining moving directions of the holder pin.

Subsequently, when the wafer 24 shifts in the Y direction while the holder pins 40 and 42 are in contact with the wafer 24, a contact point between the wafer 24 and the holder pin 40 shifts from D to D' as shown in FIG. 7. However, since the holder pin 40 shifts in a C direction due to elastic force of the coil spring 48, the contact point with the holder pin 40 shifts from D to E. As a result, the side of the wafer 24 and a contacting part of the holder 40 rub each other between D' and E.

However, the holder pins 40 and 42 rotate freely while being rotatably supported by the bearing 44 in the embodiment. Thus, between D' and E, the holder pin 40 shifts as it rotates in a G direction and pushes the wafer 24 in the D' direction. Accordingly, the wafer 24 can be shifted to a stationary position while friction or rubbing between the side of the wafer 24 and the holder pin 40 is prevented.

Due to the same mechanism, it is also possible to shift the wafer 24 to the stationary position without generating friction or rubbing between the side of the wafer 24 and the holder pin 42.

Moreover, when the wafer 24 thermally expands in heating and implanting processes, in addition to the process of mounting the wafer 24 on the wafer holder 20, and force from the wafer 24 works on the holder pins 40 and 42, the holder pins 40 and 42 rotate due to the force. Thus, the thermal expansion of the wafer 24 becomes free without generating friction or rubbing between the wafer 24 and the holder pins 40 and 42. Accordingly, it becomes possible to prevent particles from generating from a contacting part between the wafer 24 and the holder pins 40 and 42, thus contributing to quality improvement.

Figure 8:
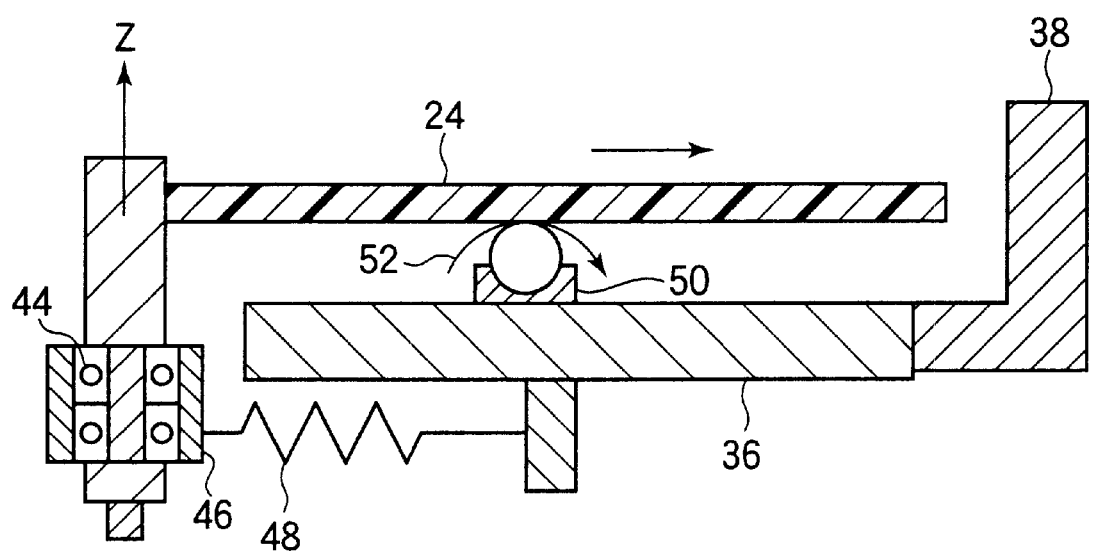
FIG. 8 is a partially sectional view, explaining a modification of the first embodiment of the present invention.

Subsequently, a modification of the embodiment will be explained based on FIG. 8. In the embodiment, a housing 50 is fixed on the wafer holder base 36. At the top side of the housing 50, a spherical recess is formed. A spherical body 52 is rotatably mounted in the recess to rotatably hold the bottom side of the wafer 24 at the surface of the spherical body 52.

In the modification, the wafer 24 moves while rubbing the surface of the spherical body 52 in the process of shifting the wafer 24 until it contacts the wafer fixing part 38 and becomes stationary. However, the spherical body 52 freely rotates in the moving direction of the wafer 24. Thus, the wafer 24 can be shifted until it contacts the wafer fixing part 38 without generating friction or rubbing between the wafer 24 and the spherical body 52 while changing contact points between the wafer 24 and the spherical body 52. Accordingly, particles are not generated from a contacting part between the spherical body 52 and the wafer 24, which contributes to quality improvement.

In the embodiment, the holder pins 40 and 42 are in a cylindrical shape. However, the holder pins 40 and 42 may have the following shape. A cylindrical small diameter part is formed at one part of the holder pins 40 and 42, in other words, at a contacting part with the wafer 24, and large diameter parts are provided at both sides of the small diameter part. A tapered surface with a gradually increasing diameter from the small diameter part towards each large diameter part is formed between the small diameter part and each large diameter part.

Among holding means, parts which are in contact with an implanting object, are rotatable at an axis which is parallel to the axial center of the holder, as the center of rotation according to the ion implanter of the embodiment of the present invention. Thus, even if friction or rubbing is generated between the implanting object and the holding means, contacting parts between the holding means and the implanting object rotate. Accordingly, friction or rubbing is avoided and the generation of particles is prevented, which contributes to quality improvement.

Figure 9:
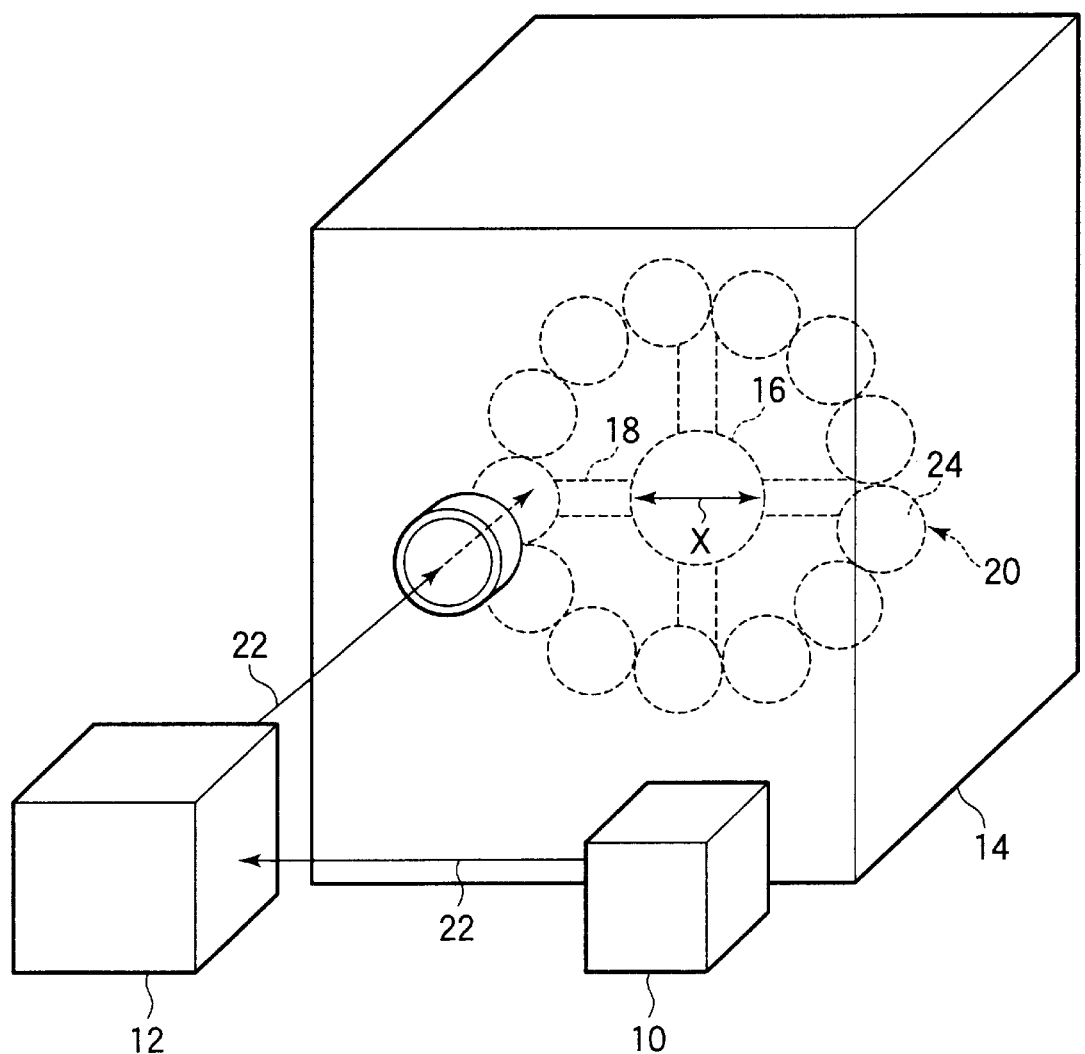
FIG. 9 is a diagram, showing an entire configuration of an ion implanter according to a second embodiment of the present invention.

A second embodiment of the present invention will be explained below based on drawings. FIG. 9 is a view, showing an entire configuration of an ion implanter according to the second embodiment of the present invention. The ion implanter includes the ion source 10, the mass separator 12, the processing chamber (end station) 14, the rotary disk 16, the holder arm 18, the wafer holder 20 and the like in FIG. 9.

The ion source 10 is linked to the mass separator 12 through an evacuated pipe (not shown in the figure), generating the ion beam 22 of oxygen ions and emitting the ion beam 22 to the mass separator 12. The mass separator 12 is connected to the processing chamber 14 through an evacuated pipe (not shown in the figure). The separator is an ion beam irradiating means to deflect the ion beam 22 by about 90 degrees by adding electromagnetic force to the ion beam 22 from the ion source 10, and to separate and remove only ions having a required mass, for instance, oxygen ions out of the ion beam 22 and then to irradiate the ion beam 22 of oxygen ions into the processing chamber 14 as specific ions. The processing chamber 14 is evacuated by an evacuating device (not shown in the figure), forming a processing space for the silicon wafer 24 as an implanting object in a vacuum atmosphere. The processing chamber 14 contains the rotary disk 16, the holder arm 18, the wafer holder 20 and the like therein.

The rotary disk 16 is connected to a driving source, such as a motor, as one element of a carrier means to shift the wafer holder 20 in a propagation region of the ion beams 22 of specific ions as a passing region of the silicon wafer 24. Thus, the rotary disk 16 is rotated and driven and also reciprocated along an arrow X direction, thereby rotating and scanning the silicon wafer 24 held by the wafer holder 20. Four aluminum holder arms 18 are linked to the outer circumference of the rotary disk 16 at 90° pitches, and each holder arm 18 can rotate at the center of axis as the center.

Figure 10:
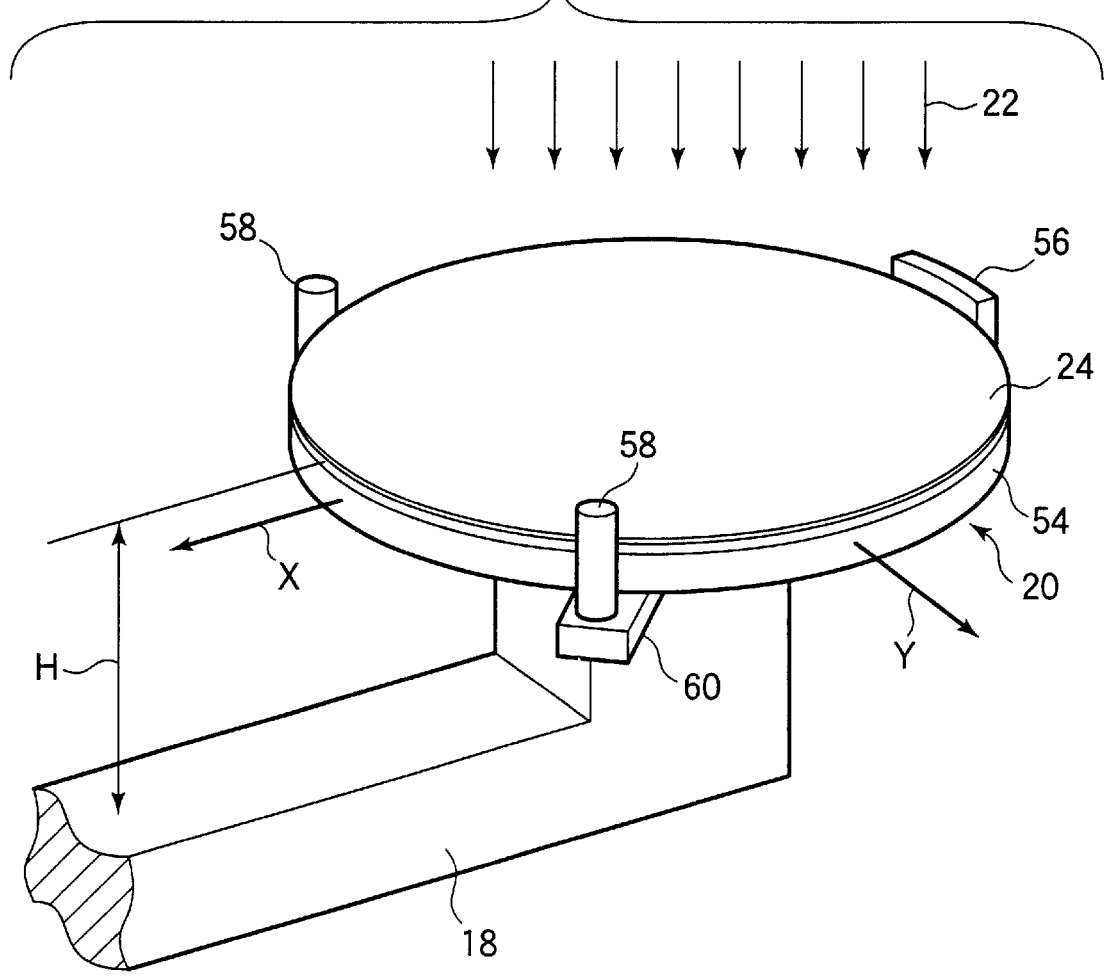
FIG. 10 is a perspective view, explaining relations between a wafer holder and a holder arm.

The tip of each holder arm 18, as shown in FIG. 10, is bent in an orthogonal direction relative to a plane of rotation of each holder arm 18, and a wafer holder base 54 is connected to the tip of the bent portion. In other words, the tip of the holder arm 18 is bent in an orthogonal direction to the irradiation direction of the ion beam 24. The wafer holder base 54 is formed of aluminum in a disc shape. A wafer chuck plate 56 is fixed to the outer circumference of the wafer holder base 54, and at the same time, two wafer chuck pins 58 are movably arranged in a diameter direction of the wafer holder base 54 so as to face the wafer chuck plate 56. A part of the wafer chuck plate 56 protrudes along the diameter direction of the wafer holder base 54 at the outer circumference of the wafer holder base 54, and is formed in a plate shape where a part thereof is in contact with the outer circumference of the silicon wafer 24 on the wafer holder base 54. The wafer chuck plate 56 may be formed in a circular shape having the same curvature as the outer shape of, for instance, the silicon wafer 24, or may have a step at a contact surface with the wafer 24 so as to contact the outer circumference of the wafer 24 to the step.

The wafer chuck pins 58 are formed in a cylindrical shape, and the bottom sides thereof are fixed to supporting plates 60. The ends of the supporting plates 60 are movably connected to the bottom side of the wafer holder base 54 along the diameter direction of the wafer holder base 54. The ends are also energized towards the center of the wafer holder base 54 by springs (not shown in the figure) fixed at the bottom of the wafer holder base 54. The outer periphery of the silicon wafer 24 is held by the spring force (elastic force) of the springs. The ends of the supporting plates 60 are connected to a pusher (not shown in the figure). When the wafer 24 is set on the wafer holder base 54, the supporting plates 60 separate from the wafer holder base 54 as they oppose the spring force by the pusher drive, and the wafer 24 is then set over the wafer holder base 54. When the pusher stops driving after the silicon wafer 24 is set, the silicon wafer 24 shifts towards the wafer holder base 54 due to spring force.

In other words, the wafer holder 20 holds the outer circumference of the silicon wafer 24 at three points, including the wafer chuck plate 56 and two wafer chuck pins an as holding means to movably hold the silicon wafer 24 as an implanting object in the embodiment.

Furthermore, contacting parts of the wafer chuck plate 56 and the wafer chuck pins 58 with the silicon wafer 24 are made of a material having good contactability with the silicon wafer 24, for instance, tantalum, silicon carbide and carbon (graphite) in the embodiment.

In the ion implanter mentioned above, the rotary disk 16 was rotated and driven at 500 rpm under high temperature of 500° C. or higher. At the same time, the ion beam 22 of oxygen ions was irradiated to the silicon wafer 24, and oxygen ions were implanted for about four hours and annealing was then carried out, thus forming a $SiO_2$ crystal layer as an insulating film in the silicon wafer 24. In this case, centrifugal force is always added to the silicon wafer 24 on each wafer holder 20, causing abrasion between the silicon wafer 24 and the wafer chuck plate 56 as well as the wafer chuck pin 58. However, since a material having good contactability is used for the contacting parts of the wafer chuck plate 56 and the wafer chuck pin 58 with the silicon wafer 24, it is possible to prevent particles from generating at the contacting parts.

Moreover, in the embodiment, the tip side of each holder arm 18 is bent and a height H is kept between the holder arm 18 and the silicon wafer 24. Thus, even if the holder arm 18 is irradiated with the ion beam 22 and particles generate from the holder arm 18, the particles are prevented from contaminating the silicon wafer 24.

Moreover, materials having little foreign matter and metal contamination, such as silicon, quartz and carbon, are used as a base material for the wafer chuck plate 56 and the wafer chuck pin 58.

The contacting parts of the wafer chuck plate 56 and the wafer chuck pin 58 with the silicon wafer 28 are connected to the wafer holder base 54 through a conductive line made of tantalum. Thus, even if the silicon wafer 24 is charged by the implantation of the ion beam 22, the electric charge flows to an earth side through the wafer holder base 54 and the holder arm 18, thus preventing the generation of particles due to electric charge.

Figure 11:
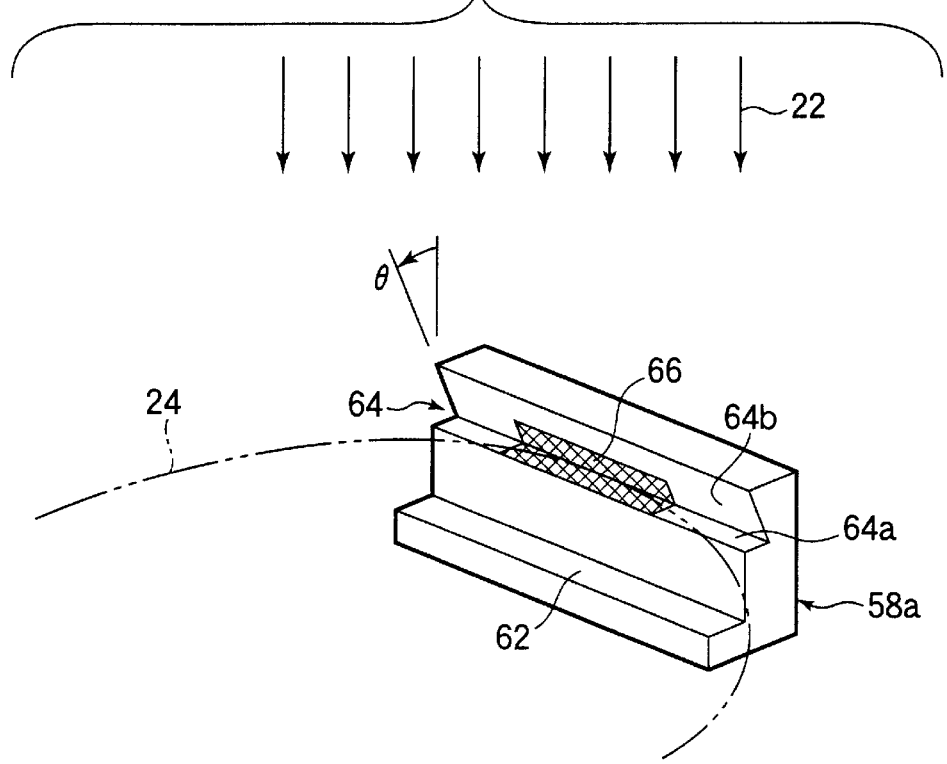
FIG. 11 is a perspective view, showing a modification of a wafer chuck plate.

Subsequently, the modification of the wafer chuck plate will be explained based on FIGS. 11 and 12. The wafer chuck plate 56a in the modification is formed roughly in a rectangular parallelopiped shape. A step part 62 is formed at the bottom side, and a V-groove 64 is formed at a side meeting the silicon wafer 24, in other words, a contacting part with the silicon wafer 24. One surface 64a of the V-groove 64 is parallel to the wafer holder base 54, and the other surface, as an inclined surface 64b, is inclined relative to the irradiation direction of the ion beam 22 only by an angle θ towards the wafer holder base 54. In other words, the inclined surface 64b is formed so as to prevent direct irradiation of the ion beam 22 into the V-groove 64.

Furthermore, a rectangular-shaped foil tantalum material 66 is mounted roughly at the center of the V-groove 64. In other words, the wafer chuck plate 56a is made of a base material with little foreign matter and metal contamination such as silicon, quartz and carbon. On the other hand, the tantalum material 66 is mounted on a contacting part of the wafer chuck plate 56a with the silicon wafer 24 among materials having good contactability with the silicon wafer 24, including tantalum, silicon carbide and carbon (graphite).

Figure 12:
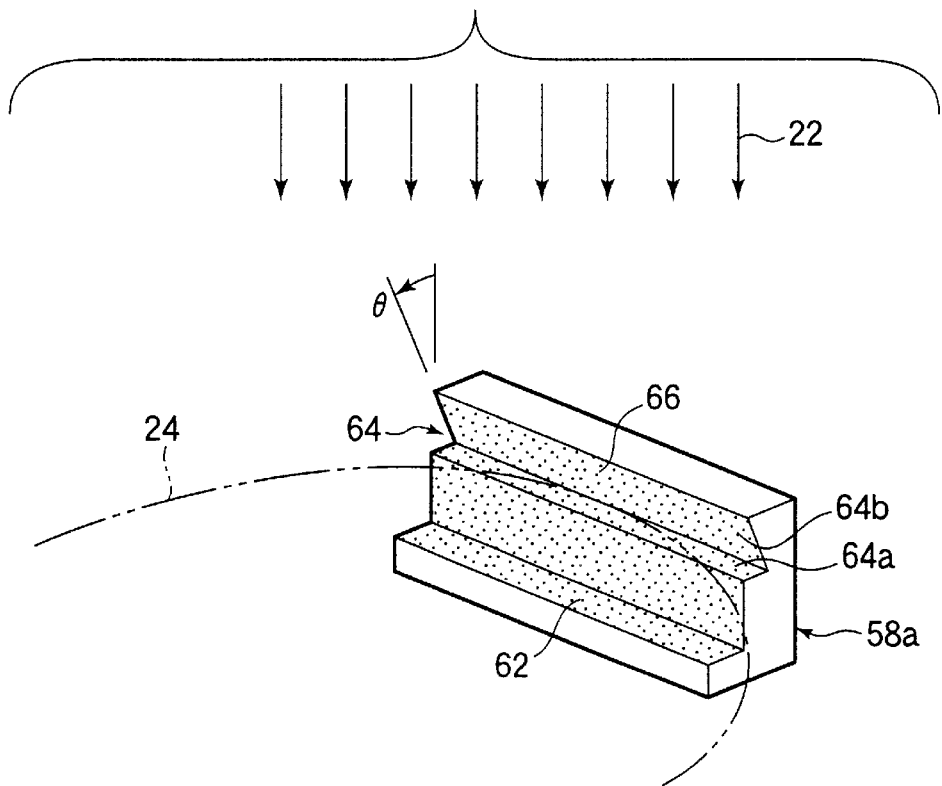
FIG. 12 is a perspective view, showing another modification of a wafer chuck plate.

In mounting the tantalum material 66 on the wafer chuck plate 56a, as shown in FIG. 12, the surface of the step 62 and the side surface of the wafer chuck plate 56a may be entirely deposited with the tantalum material 66.

In the modification, the foil tantalum material 66 is mounted or entirely deposited on the V-groove 64 while the outer circumference of the silicon wafer 24 is held at the V-groove 64. Thus, the generation of particles from the contacting part with the silicon wafer 24 can be prevented. Furthermore, the V-groove 64 has an inclined surface, so that the tantalum material is prevented from scattering and contaminating as the ion beam 22 does not directly irradiate the V-groove 64.

Although the V-groove 64 is formed straight in the modification, it may be formed in a circular shape having the same curvature as the outer shape of the silicon wafer 24.

Moreover, a shielding plate may be arranged to shield the ion beam 22 at the top side of the V-groove 64, or the tantalum material 66 may be mounted only at an inner part of the V-groove 64 in the modification.

Figure 13:
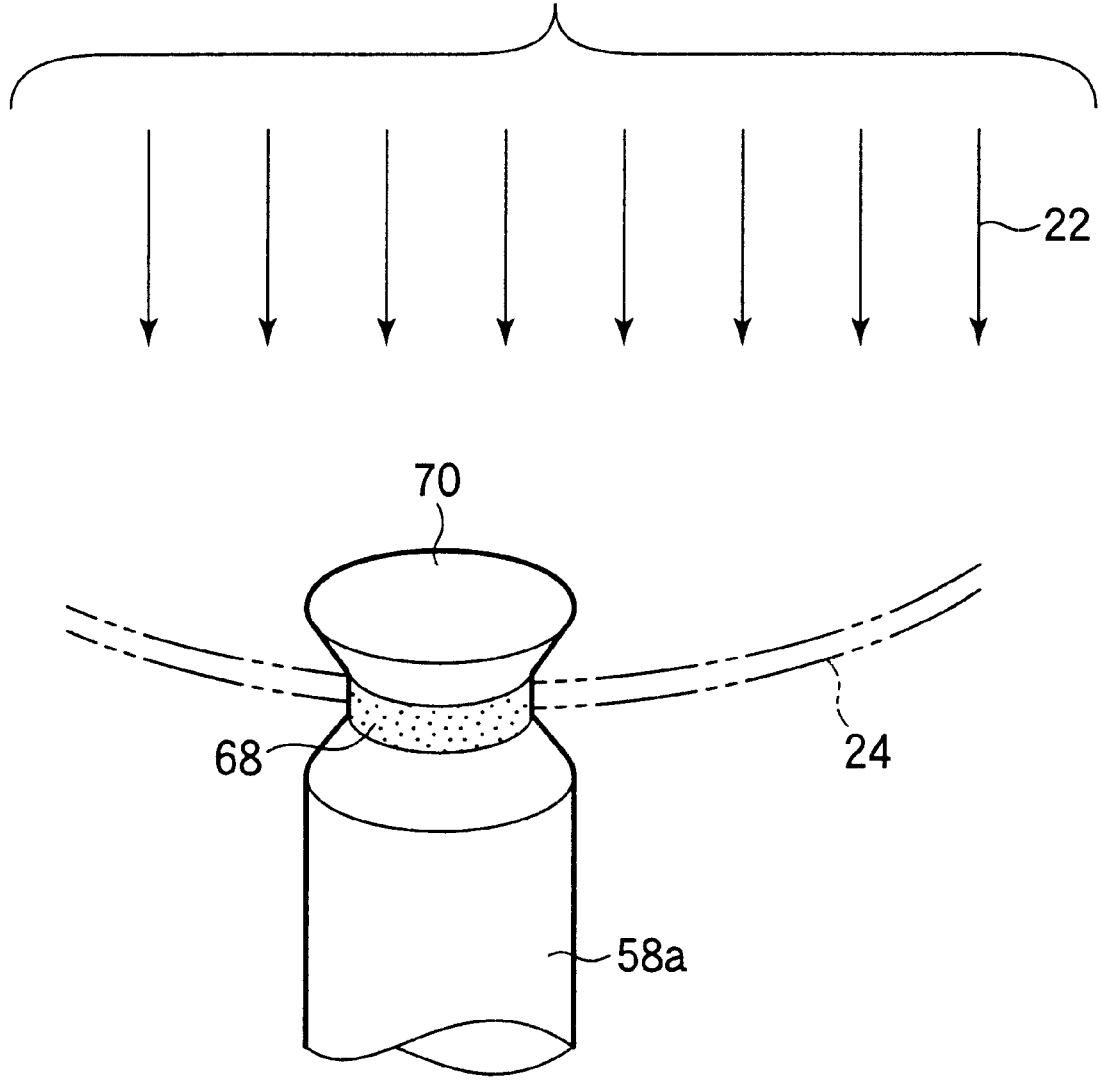
FIG. 13 is a perspective view, showing a modification of a wafer chuck pin.
Figure 14:
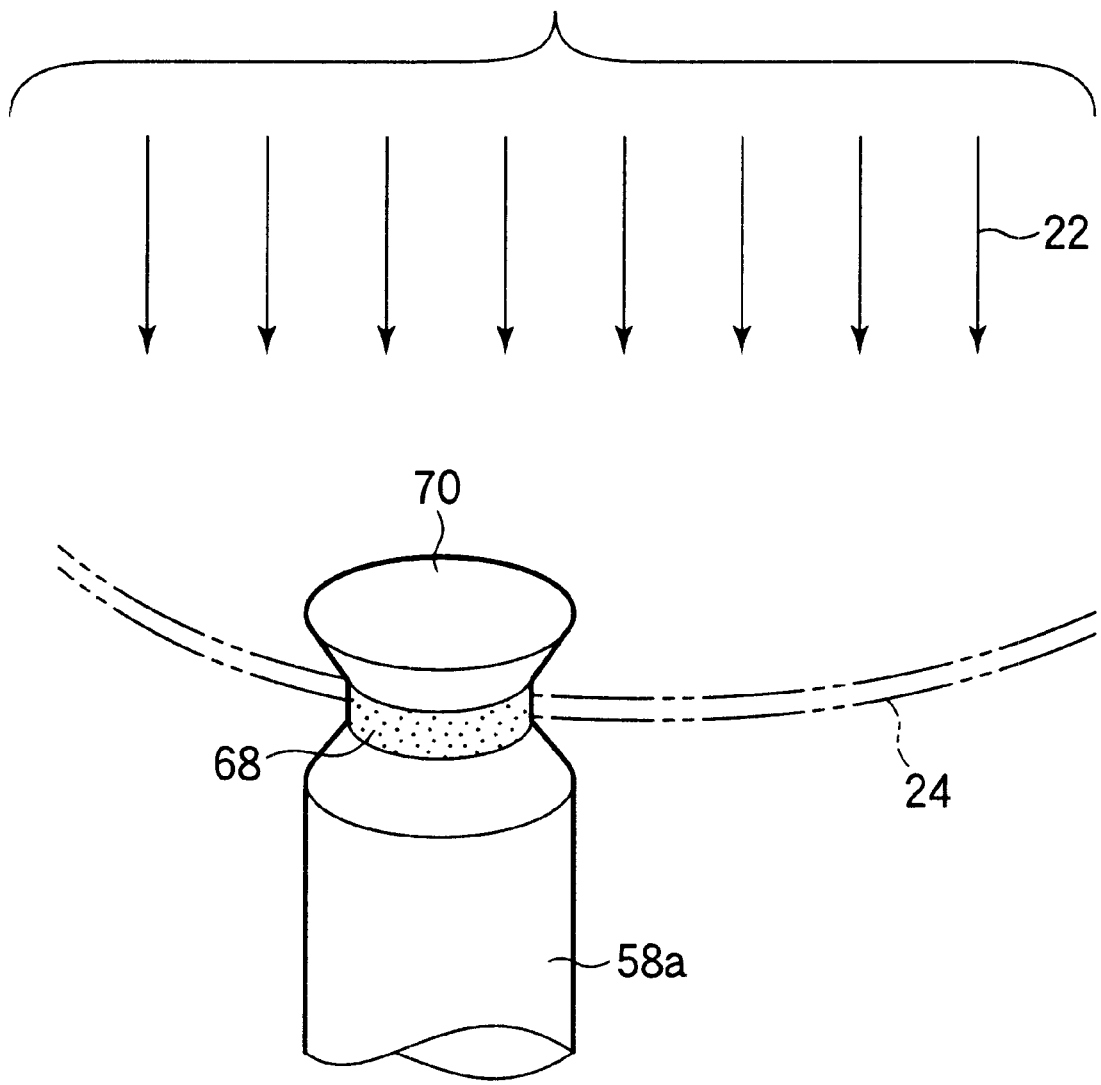
FIG. 14 is a perspective view, showing another modification of a wafer chuck pin.

Subsequently, the modification of the wafer chuck pin will be explained based on FIGS. 13 and 14. In the modification, the wafer chuck pin 58a is formed in a cylindrical shape by using a material with little foreign matter and metal contamination such as silicon, quartz and carbon. At the top side of the wafer chuck pin 58a, a cylindrical tantalum ring 68 is formed as a small diameter part at a contacting part with the wafer 24. A large diameter part 70 having a larger diameter than the tantalum ring 68, and a wafer chuck pin main body (large diameter part) are provided at both sides of the tantalum ring 68 therebetween. A tapered surface with a gradually increasing diameter from the tantalum ring 68 towards each large diameter part is formed between the tantalum ring 68 and each large diameter part.

The wafer chuck pin 58a is made of a material with little foreign matter and metal contamination, such as silicon, quartz and carbon, as a base material. The tantalum ring 68 is made of tantalum material as a material having good contactability with the silicon wafer 24. In forming the tantalum ring 68, as shown in FIG. 14, tantalum material may be deposited only on the surface of the tantalum ring 68.

Since tantalum material is used for a contacting part of the wafer chuck pin 58a with the silicon wafer 24 in the modification, it is possible to prevent particles from generating at the contacting part of the wafer chuck pin 58a with the silicon wafer 24. At the same time, direct irradiation of the ion beam 22 into the tantalum ring 68 is prevented by the large diameter part 70, thereby preventing the tantalum material from scattering and contaminating.

Moreover, a wire made of tantalum may be wound at the part of the tantalum ring 68, instead of the tantalum ring 68.

Figure 15:
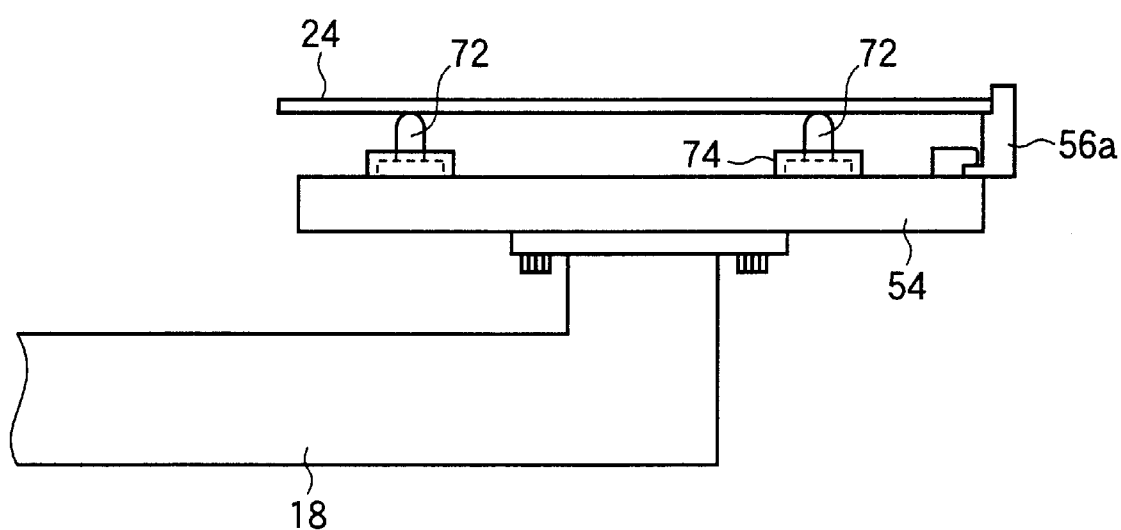
FIG. 15 is a side view, showing a modification of a wafer holder.

Subsequently, the modification of the wafer holder 20 will be explained based on FIG. 15. A plurality of wafer installation pins 72 are installed on the wafer holder base 54 in the modification, and each wafer installation pin 72 is made of tantalum. The end side of each wafer installation pin 72 is formed roughly in a spherical shape, and each wafer installation pin 72 is fixed to the wafer holder base 54 through supporting plates 74. When the silicon wafer 24 is set on the wafer holder 20, each wafer installation pin 72 holds the bottom side of the silicon wafer 24.

According to the modification, the outer periphery of the silicon wafer 24 is held by the wafer chuck plate 56 and two wafer chuck pins 58, and at the same time, the bottom side of the silicon wafer 24 is held by each wafer installation pin 72. Accordingly, the silicon wafer 24 can be held more firmly.

As a band-shaped grounding line made of tantalum is connected to the tantalum material 38 and the grounding line is connected to the wafer holder base 54 in constituting the wafer chuck plate 56a, electric charge can be discharged to the earth.

The generation of particles was checked in a conventional ion implanter and the ion implanter of the embodiment by irradiating the ion beam 22 to 8-inch silicon wafer 24. There were 1,000 or more particles having a particle diameter of 0.2 $\mu$m or larger per 8-inch silicon wafer 24 in the conventional ion implanter. However, the number of the particles was reduced to less than 200 by using the ion implanter of the embodiment.

As explained above, according to the ion implanter of the embodiment of the present invention, a material having good contactability with an implanting object is used for a contacting part, as a holding means, with the implanting object, thus preventing particles from generating from the contacting part and contributing to quality improvement.

What is claimed is:

1. An ion implanter comprising a processing chamber which forms a processing space for an object to be implanted in a vacuum atmosphere; an ion beam irradiating means to irradiate an ion beam output from an ion source into the processing chamber; a holding means which is arranged in said processing chamber and holds the object to be implanted; and a carrier means to shift said holding means in a propagation region of an ion beam in said processing chamber as a passing region of the object to be implanted; wherein said holding means includes a fixing member which contacts a part of a periphery of the object to be implanted, a holding member which pushes the object to be implanted in the direction of said fixing member at another part of the periphery of the object to be implanted, and a supporting member which rotatably supports said holding member so that moving in the direction along the periphery of the object to be implanted is allowed.

2. The ion implanter according to claim 1, wherein said holding means comprises a holder base which is fixed to said carrier means and holds a bottom side of the object to be implanted, said fixing member is fixed to an outer circumference of said holder base and a part of which protrudes along a diameter direction of said holder base, said holding member is movably arranged to face said fixing member at an outer circumference of said holder base and holds a side of the object to be implanted on said holder base, and said supporting member is movably arranged at an outer circumference of said holder base along a diameter direction of said holder base and rotatably supports said holding member and rotatably supports said holding member at an axis which is parallel to an axial center of said holder base as a center of rotation.

3. The ion implanter according to claim 1, wherein said carrier means comprises a rotary disk which is rotated and driven by a driving source, and a plurality of holder arms which are connected to said rotary disk and are radially arranged at an outer circumference of said rotary disk; and wherein said holder base is fixed to tip sides of said plurality of holder arms.

4. The ion implanter according to claim 1, wherein said object to be implanted is implanted with oxygen ions.

5. The ion implanter according to claim 1, wherein said ion source generates and outputs an ion beam; said ion beam irradiating means removes specific ions from an ion beam output from said ion source and irradiates an ion beam of specific ions into said processing chamber, said carrier means shifts said holding means in a propagation region of an ion beam of specific ions in said processing chamber as a passing region of the object to be implanted, said holding means comprises a holder base which is fixed to said carrier means and holds a bottom side of the object to be implanted, said fixing member is fixed to an outer circumference of said holder base and a part of which protrudes along a diameter direction of said holder base, plurality of said holding members are movably arranged to face said fixing member at an outer circumference of said holder base and hold a side of an object to be implanted on said holder base, and plurality of said supporting members are movably arranged at an outer circumference of said holder base along a diameter direction of said holder base and rotatably supports each holding member and rotatably support each holding member at an axis which is parallel to an axial center of said holder base as a center of rotation.

6. The ion implanter according to claim 5, wherein said holding members comprise a cylindrical small diameter part as a contacting part with the object to be implanted, and large diameter parts which have a larger diameter than the small diameter part and are formed at both sides of the small diameter part; and wherein tapered surfaces whose diameters gradually increase from the small diameter part to each large diameter part, are formed between the small diameter part and each large diameter part.

7. The ion implanter according to claim 5, wherein a spherical body which rotates due to contact with the object to be implanted, is rotatably fixed to said holder base.

8. The ion implanter according to claim 5, wherein a bearing is mounted at a contacting part of said supporting member with said holding member.

9. The ion implanter according to claim 8, wherein said bearing comprises ceramics.

10. An ion implanter comprising a processing chamber which forms a processing space for an object to be implanted in a vacuum atmosphere; an ion beam irradiating means to irradiate an ion beam output from an ion source into said processing chamber; a holding means which is arranged in said processing chamber and movably holds the object to be implanted; and a carrier means to shift said holding means in a propagation region of an ion beam in said processing space as a passing region of the object to be implanted; wherein said holding means comprises a disc-shaped holder base, a chuck plate which is fixed to an outer circumference of said holder base and a part of which protrudes in a diameter direction of said holder base, and a chuck pin which is movably arranged along the diameter direction of said holder base to face said chuck plate at the outer circumference of said holder base and a part of which protrudes in the diameter direction of said holder base; wherein an outer circumference of an object to be implanted arranged on said holder base is held by said chuck plate and said chuck pin.

11. The ion implanter according to claim 10, wherein said carrier ion source generates and outputs an ion beam; said ion beam irradiating means removes specific ions from an ion beam output from said ion source and irradiates an ion beam of specidic ions into said processing space; and said carrier means shifts said holding means in a propagation region of an ion beam of specific ions in said processing chamber as a passing region of the object to be implanted.

12. The ion implanter according to claim 10, wherein said carrier means comprises a rotary disk which is rotated and driven by a driving source, and a plurality of holder arms which are connected to said rotary disk and are radially arranged at an outer circumference of said rotary disk; and wherein said holder base is fixed to tip sides of said plurality of holder arms.

13. The ion implanter according to claim 12, wherein tip sides of said plurality of holder arms are bent in an orthogonal direction to a plane of rotation of each holder arm; and said holder base is fixed to tips of bent parts.

14. The ion implanter according to claim 10, wherein a contact surface of said chuck plate as a contacting part with the object to be implanted has a V-groove; one surface of the V-groove is formed parallel to said holder base and another surface of said V-groove is inclined relative to an irradiating direction of the ion beam towards said holder base as an inclined surface.

15. The ion implanter according to claim 14, wherein said V-groove of the chuck plate is formed of a curvature which matches an outer shape of the object to be implanted.

16. The ion implanter according to claim 10, wherein said chuck pin is formed in a cylindrical shape at least at a contacting part with the object to be implanted.

17. The ion implanter according to claim 10, wherein said chuck pin comprises a cylindrical small diameter part as a contacting part with the object to be implanted, and large diameter parts which have a larger diameter than the small diameter part and are formed at both sides of the small diameter part; and wherein tapered surfaces whose diameters gradually increase from the small diameter part to each large diameter part, are formed between the small diameter part and each large diameter part.

18. The ion implanter according to claim 10, wherein a contacting part of said holding means with the object to be implanted is made of tantalum.

19. The ion implanter according to claim 10, wherein a contacting part of said holding means with the object to be implanted is made of silicon carbide.

20. The ion implanter according to claim 10, wherein a contacting part of said holding means with the object to be implanted is made of carbon.

21. The ion implanter according to claim 10, wherein said object to be implanted is implanted with oxygen ions.

22. An ion implanter comprising a processing chamber which forms a processing space for a wafer in a vacuum atmosphere; an ion beam irradiating means to irradiate an ion beam output from an ion source into the processing chamber; a wafer holder which is arranged in said processing chamber and holds the wafer; and a carrier means to shift said wafer holding in a propagation region of an ion beam in said processing chamber as a passing region of the wafer, wherein said wafer holder has a holder base which is fixed to said carrier means and holds a bottom side of the wafer, a wafer fixing part which is supported with said holder base and contacts a part of an outer circumference of the wafer, holder pins which are formed in a cylindrical shape and pushes the wafer by contacting a circumferentail surface of said cylindrical holder pin with another part of the outer circumference of the wafer, and a supporting member which moves the wafer in the direction of said wafer fixing part by moving said holder pin; wherein said supporting member rotatably support said holder pin so that moving in the direction along the outer circumference of the wafer is allowed.

23. The ion implanter according to claim 22, wherein said object to be implanted is implanted with oxygen ions.

24. An ion implanter comprising a processing chamber which forms a processing space for an object to be implanted in a vacuum atmosphere; an ion beam irradiating means to irradiate an ion beam output from an ion source into the processing chamber; a holding means which is arranged in said processing chamber and movably holds the object to be implanted; and a carrier means to shift said holding means in a propagation region of an ion beam in said processing chamber as a passing region of the object to be implanted; wherein said holding means has a chuck plate which supports a part of a periphery of the object to be implanted, a holder pin which holds the periphery of the object to be implanted together with said chuck plate by pushing the object to be implanted at another part of the periphery of the object to be implanted in the direction of said chuck plate, a base material for said chuck plate, which irradiating with the ion beam, is made of any one of silicon, quartz and carbon and a contracting parts of said chuck plate with the object to be implanted is made of any one of tantalum, silicon carbide and carbon.

25. The ion implanter according to claim 24, wherein said object to be implanted is implanted with oxygen ions.

* * * * *